US007889537B2

(12) United States Patent
Edahiro et al.

(10) Patent No.: US 7,889,537 B2
(45) Date of Patent: Feb. 15, 2011

(54) NON-VOLATILE MEMORY DEVICE AND METHOD FOR WRITING DATA THERETO

(75) Inventors: Toshiaki Edahiro, Yokohama (JP); Kazushige Kanda, Kawasaki (JP); Naoya Tokiwa, Fujisawa (JP); Takuya Futatsuyama, Yokohama (JP); Koji Hosono, Fujisawa (JP); Shigeo Ohshima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/118,064

(22) Filed: May 9, 2008

(65) Prior Publication Data
US 2009/0052227 A1    Feb. 26, 2009

(30) Foreign Application Priority Data
May 11, 2007  (JP) ............................ 2007-127090

(51) Int. Cl.
*G11C 11/00* (2006.01)
*G11C 17/00* (2006.01)
(52) U.S. Cl. ....................................... 365/148; 365/100
(58) Field of Classification Search ................... 365/148
See application file for complete search history.

(56) References Cited

U.S. PATENT DOCUMENTS

| 5,994,757 | A | * | 11/1999 | Ichikawa et al. ............. 257/530 |
| 6,831,854 | B2 | | 12/2004 | Rinerson et al. |
| 7,092,277 | B2 | | 8/2006 | Bedeschi et al. |
| 7,248,475 | B2 | | 7/2007 | Paydar et al. |
| 7,307,268 | B2 | | 12/2007 | Scheuerlein |
| 7,535,748 | B2 | * | 5/2009 | Shirahama et al. .......... 365/148 |
| 7,539,040 | B2 | * | 5/2009 | Tamai et al. ................. 365/148 |
| 7,570,511 | B2 | * | 8/2009 | Cho et al. ..................... 365/163 |
| 2006/0187115 | A1 | | 8/2006 | Terashima et al. |
| 2006/0203541 | A1 | | 9/2006 | Toda |

FOREIGN PATENT DOCUMENTS

| JP | 7-263647 | 10/1995 |
| JP | 2004-319587 | 11/2004 |
| JP | 2007-73176 | 3/2007 |
| JP | 2008-123595 | 5/2008 |
| WO | WO 02/078003 A2 | 10/2002 |

OTHER PUBLICATIONS

U.S. Appl. No. 12/266,884, filed Nov. 7, 2008, Tokiwa.
Y. Hosoi, et al., "High Speed Unipolar Switching Resistance RAM (RRAM) Technology", IEEE International Electron Devices Meeting 2006, Tech. Dig., pp. 793-796.
U.S. App. No. 12/752,646, filed Apr. 1, 2010, Kawaguchi.
U.S. App. No. 12/755,891, filed Apr. 7, 2010, Sonenara et al.

\* cited by examiner

*Primary Examiner*—Son L Mai
(74) *Attorney, Agent, or Firm*—Oblon, Spivak, McClelland, Maier & Neustadt, L.L.P.

(57) ABSTRACT

The present invention provides a method for writing data to a non-volatile memory device having first wirings and second wirings intersecting one another and memory cells arranged at each intersection therebetween, each of the memory cells having a variable resistive element and a rectifying element connected in series. According to the method, the second wirings are charged to a certain voltage not less than a rectifying-element threshold value, prior to a rise in a selected first wiring. Then, a selected first wiring is charged to a voltage required for writing or erasing, after which a selected second wiring is discharged.

15 Claims, 9 Drawing Sheets

NON-VOLATILE MEMORY DEVICE AND METHOD FOR WRITING DATA THERETO

CROSS REFERENCE TO RELATED APPLICATIONS

This application is based on and claims the benefit of priority from prior Japanese Patent Application No. 2007-127090, filed on May 11, 2007, the entire contents of which are incorporated herein by reference.

BACKGROUND OF THE INVENTION

1. Field of the Invention

The present invention relates to a memory device configured by electrically rewritable non-volatile memory cells, and in particular, to a non-volatile memory device using variable resistive elements as memory elements to store the resistance values as data, and a method for writing data thereto.

2. Description of the Related Art

Recently, ReRAM (Resistive Random Access Memory) has gained increasing attention as a non-volatile memory device that stores resistance value information of electrically rewritable variable resistive elements in a non-volatile manner, which is a technology currently studied in various research laboratories.

The ReRAM has variable resistive elements as its storage elements that are configured by layers of an electrode/a metal oxide/an electrode. The variable resistive elements are known to have two types of operational modes. One operational mode involves switching between a high-resistance state and a low-resistance state by changing polarity of the applied voltage, which is referred to as "bipolar type". The other involves switching between a high-resistance state and a low-resistance state by Controlling values and application time of voltage without changing polarity of the applied voltage, which is referred to as "unipolar type" (or "non-polar type").

The unipolar type is preferable to achieve high-density memory cell arrays. This is because the unipolar type enables cell arrays to be configured by superposing a variable resistive element and a rectifying element such as a diode on each cross point of a bit line and a word line without any transistors.

When cross-point type cell arrays are configured without any rectifying elements, a write disturbance occurs in writing at non-selected cells due to crosstalk. In order to mitigate such effects, such a scheme is disclosed in Patent Document 1 where a write-compensation voltage is applied to the non-selected memory cells after the application of a write voltage.

On the other hand, to prevent such crosstalk in cross-point type cell arrays, a rectifying element such as a diode may be superposed on a variable resistive element (see, for example, Patent Document 2).

For example, a homopolar voltage may be used for writing and erasing and that shorter pulses may be used for writing while longer pulses used for erasing in cross-point type cell arrays, which is disclosed in, e.g., non-Patent Document 1.

[Patent Document 1] Japanese Patent Laid-Open No. 2006-344349

[Patent Document 2] U.S. Pat. No. 6,831,854

[Non-Patent Document 1] Y. Hosoi et al, "High Speed Unipolar Switching Resistance RAM (RRAM) Technology" IEEE international Electron DEVICES meeting 2006 Technical DIGEST p. 793-796

SUMMARY OF THE INVENTION

One aspect of the present invention provides a method for writing data to a non-volatile memory device having first wirings and second wirings intersecting one another and memory cells arranged at each intersection therebetween, each of the memory cells having a variable resistive element and a rectifying element connected in series, the method comprising:

charging the second wirings to a certain voltage not less than a rectifying-element threshold value, prior to a rise in a selected first wiring;

charging the selected first wiring to a voltage required for writing or erasing; and discharging a selected second wiring.

Another aspect of the present invention provides a non-volatile memory device comprising:

memory cells arranged at each intersection between word lines and bit lines intersecting one another, each of the memory cells having a variable resistive element and a rectifying element connected in series; and a sense unit connected to the bit lines, wherein the sense unit comprises:

a sense amplifier sensing data in the memory cells;

a first current path connecting the bit lines directly to a node with a predetermined potential;

a second current path connecting the bit lines via a resistor to the node with the predetermined potential; and a data processing circuit controlling the selective on-switching of the first current path or the second current path depending on write data.

DETAILED DESCRIPTION OF THE EMBODIMENTS

Embodiments of the present invention will now be described below with reference to the accompanying drawings.

Figure 1:
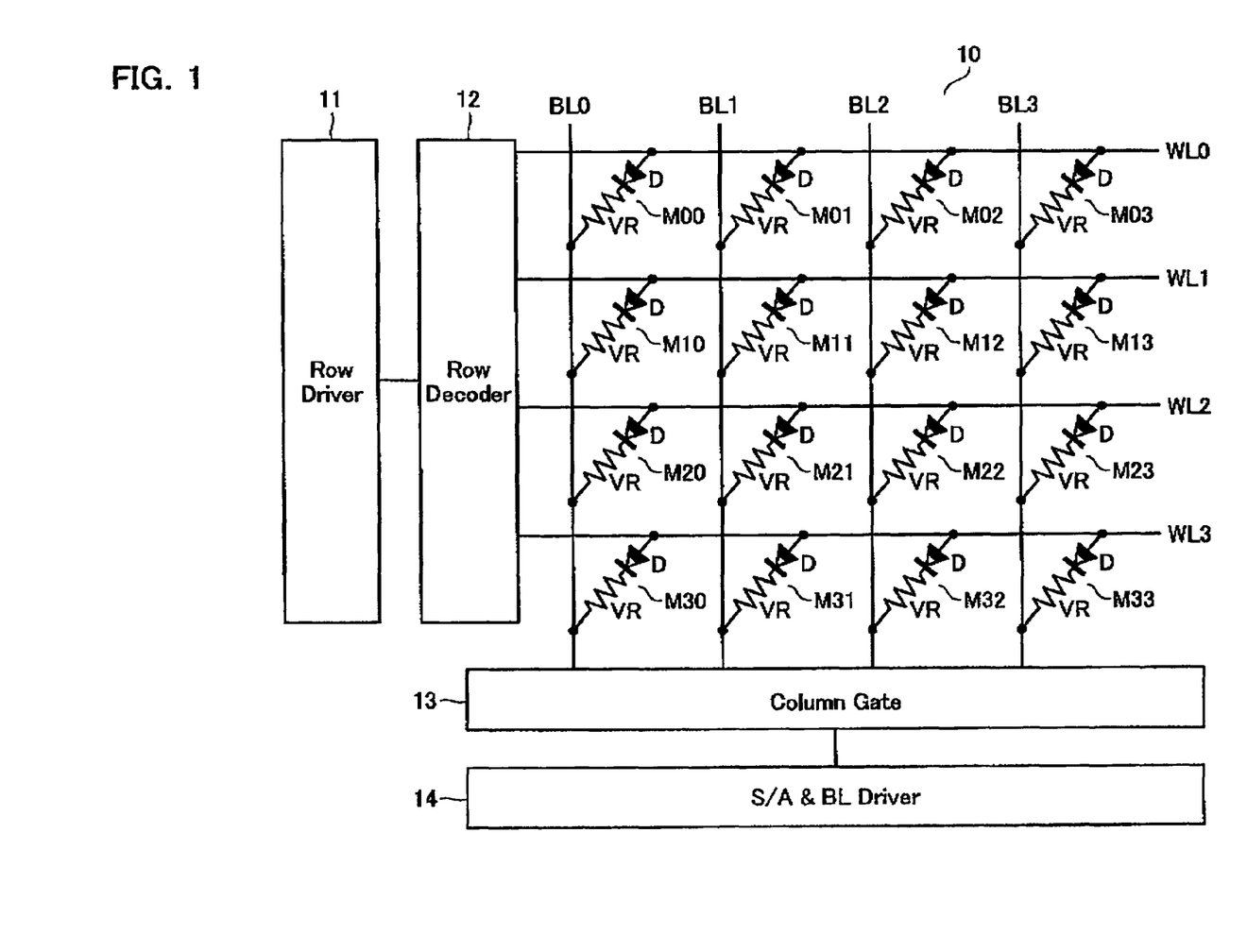
FIG. 1 is a diagram illustrating a memory core configuration of ReRAM according to an embodiment of the present invention.

FIG. 1 illustrates a configuration of a memory cell array 10 (within the range of 4×4) in a non-volatile memory device according to an embodiment of the present invention. Lines WLi (i=0, 1, 2 . . . ) in the row direction (x-direction) (hereinafter, referred to as "word lines") and others BLj (j=0, 1, 2

. . . ) in the column direction (y-direction) (hereinafter, referred to as "bit lines") are arranged to intersect one another, and each memory cell Mij is arranged at a respective intersection therebetween.

Each memory cell Mij is configured as a laminated structure of a variable resistive element VR and a rectifying element D. That is, each variable resistive element VR has one end connected to a bit line BL and the other end connected via a rectifying element D to a word line WL.

Figure 2:
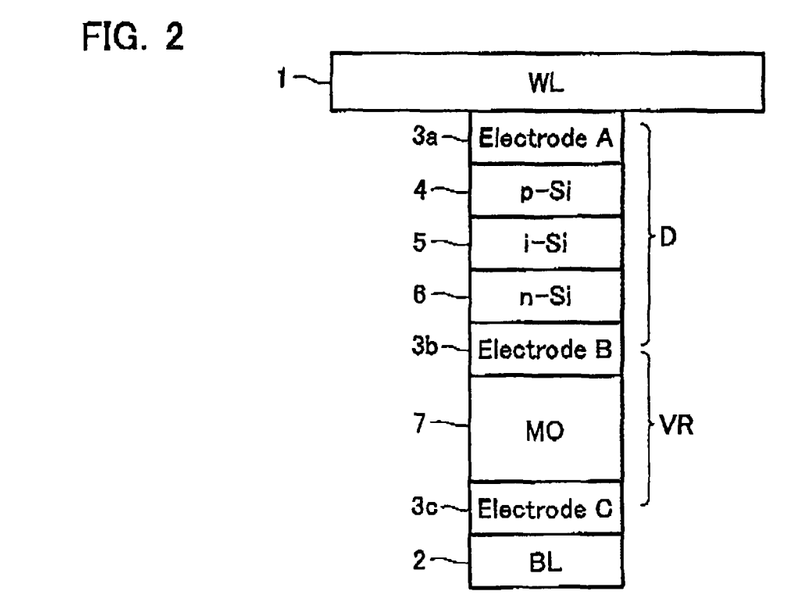
FIG. 2 is a diagram illustrating a cross-sectional structure of a memory cell in the same memory core.
Figure 3:
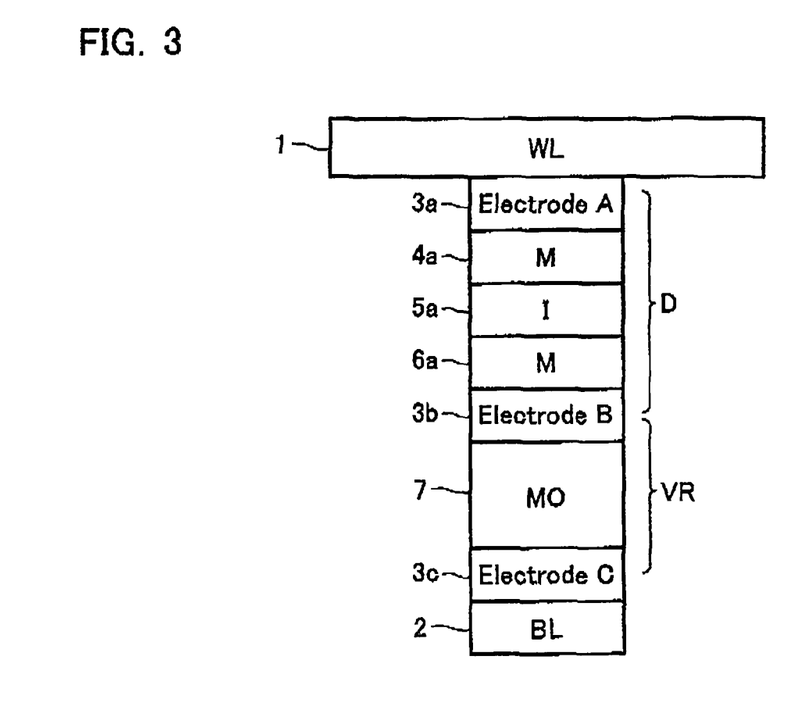
FIG. 3 is a diagram illustrating another cross-sectional structure of a memory cell in the same memory core.

FIGS. 2 and 3 illustrate a laminated structure of a variable resistive element VR and a rectifying element D, which configure a memory cell between a word line (WL) 1 and a bit line (BL) 2. The variable resistive element VR includes a metal-oxide (MO) film 7 sandwiched between electrodes 3b and 3c. A specific metal oxide being used includes a transition metal oxide, such as NiO or TiO, or that doped with an appropriate additive.

In FIG. 2, the rectifying element D is a pin diode including a p-type silicon layer 4/an i-type silicon layer 5/an n-type silicon layer 6, and in FIG. 3, an MIM diode using layers of a metal film 4a/an insulating film 5a/a metal film 6a.

As the electrode 3a, such a material is used through which an ohmic contact may be formed between the word line (WL) 1 and the rectifying element D. As the electrode 3b, such a material is used through which an ohmic contact may be formed between the rectifying element D and a variable resistive element VR. As the electrode 3c, such a material is used through which an ohmic contact may be formed between the bit line (BL) 2 and the variable resistive element VR.

Figure 4:
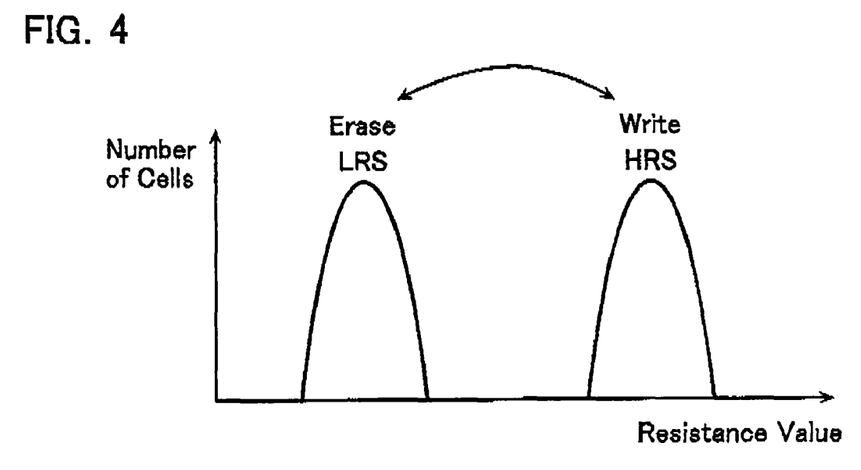
FIG. 4 is a diagram illustrating a data state of a memory cell.

In this embodiment, as illustrated in FIG. 4, a low-resistance state (LRS) corresponds to an erase state (e.g., "1") and a high-resistance state (HRS) corresponds to a write state (e.g., "0") in the variable resistive element VR. In addition, write "0" is defined as write (or set) operation in narrow definition, by which a cell in a low-resistance state LRS is brought into a high-resistance state HRS, while write "1" is defined as erase (or reset) operation by which a cell in a high-resistance state HRS is brought into a low-resistance state LRS.

Each of the bit lines BL is connected to a sense amplifier (and bit-line driver) 14 via a column gate 13 that is selectively controlled by column addresses. Each of the word lines WL is connected to a row driver 11 via a row decoder 12 that decodes row addresses.

FIG. 1 illustrates an exemplary arrangement of memory cells where a corresponding rectifying element D is forward-biased when a positive bias is applied to a word line WL. However, the present invention is not limited to the illustrated embodiment and may provide such polarity with which a corresponding rectifying element D is forward-biased when a positive bias is applied to a bit line BL.

An operation for writing data to a selected memory cell through the selection of a word line WL and a bit line BL will now be described below. Let Vthre be a threshold voltage of the rectifying element D, and let all bit lines BL initially retained at the ground (GND) level Vss.

In a writing operation, a selected bit line is retained at the Vss level, non-selected bit lines are brought into floating states, and a write voltage VPGM (>Vthre) is applied to a selected word line, which enables write currents to flow into the selected memory cell. That is, write "0" (in narrow definition, write operation) or write "1" (erase operation) is performed by setting a write pulse voltage applied to the selected memory cell as well as the pulse width.

In this data write operation, the voltage level of the non-selected bit lines rises to on the order of VPGNM-Vthre, after which no current flows into the non-selected memory cells.

However, since a cell current flows into the non-selected memory cells at least momentarily with a potential difference of not less than Vthre, some write disturbance may occur and an incorrect write or erase operation may be caused.

Figure 5:
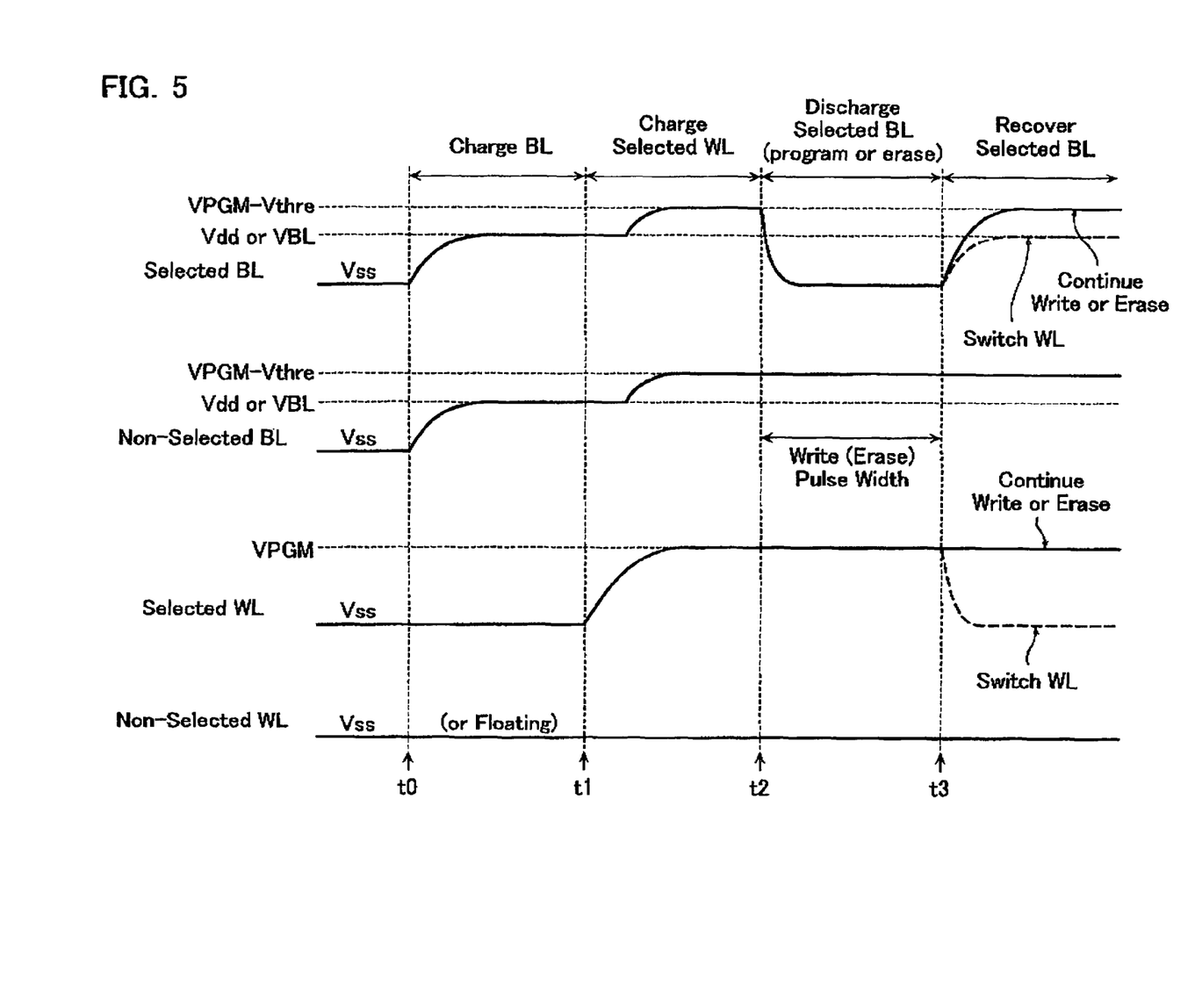
FIG. 5 is a diagram illustrating an operation waveform in writing in the same memory core.

Therefore, in this embodiment, such a write scheme is used that mitigates any write disturbance at non-selected memory cells. An exemplary operation waveform in writing is illustrated in FIG. 5 according to this embodiment.

Firstly, all of the bit lines are set to a voltage level VBL (e.g., a power-supply voltage Vdd) of not less than the threshold Vthre of the rectifying element D (at timing t0). At this moment, no current flows into any word lines WL since the rectifying elements D are reverse-biased.

Secondly, a write voltage VPGM is applied to the selected word line while retaining the non-selected word lines at Vss (or a floating state) (at timing t1). At this moment, if the voltage of the selected word line becomes equal to or higher than VBL+Vthre, currents flow from the selected word line to the corresponding bit line, whereas little bias is introduced to the memory cell and the voltage of the bit line may be increased to VPGM-Vthre. Since such little bias is introduced, no write disturbance occurs in any non-selected memory cell even if some current flows into the non-selected memory cell.

After the voltage of the selected word line reaches VPGM, a selected bit line is discharged to Vss (at timing t2). In this way, by discharging the selected bit line, a write voltage VPGM-Vthre is applied only to the selected memory cell at the intersection between the selected word line and the selected bit line. Upon completion of the write operation, the selected bit line is returned to the VBL level (at timing t3).

The time t3-t2 when the selected bit line is being discharged becomes the pulse width for writing operations to the selected memory cell. In this case, the state transition of a cell for write "0" and write "1" is as follows: For write "0", each of the variable resistive elements is retained at a low-resistance state. Then, a large cell current flows into each of the variable resistive elements. Thereafter, each of the variable resistive elements transitions to a high-resistance state in a predetermined time for applying pulses.

On the other hand, for write "1", the selected bit line is connected via a resistor Rdri to the ground, which will be explained in conjunction with a specific configuration of a sense amplifier below. As a result, the voltage applied to a variable resistive element is divided into sections by the resistor Rdri. Further, the resistor Rdri mitigates the increase in cell currents if the variable resistive element transitions to a lower resistance state, thereby enabling reduction in the voltage applied to the variable resistive element in comparison to that in write "0". Maintained in this state for a predetermined period of time (e.g., longer than that in write "0"), the variable resistive element may transition to a desired low-resistance state and obtain a "1" data state.

The non-selected bit lines are retained at VPGM-Vthre. Write operations may be performed in sequence on each of the memory cells along the selected word line, by selecting bit lines corresponding to the cells to be written to and discharging them to Vss one after another, while maintaining the selected word line at VPGM (indicated by the full line). When the selected word line is switched to another, at timing t3, the selected word line is brought into Vss (indicated by the dashed lines).

Provided that a write voltage VPGM>Vdd, the row driver 11 requires a boost voltage of not less than Vdd. The bit line driver 14 does not require any extra boost circuit if VBL is equal to Vdd.

Figure 6:
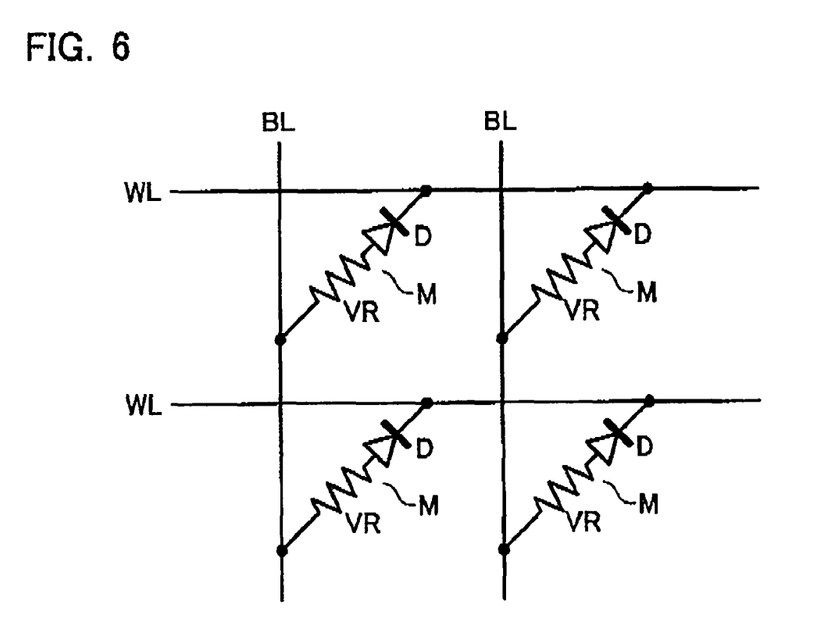
FIG. 6 is a diagram illustrating another memory cell array configuration.
Figure 7:
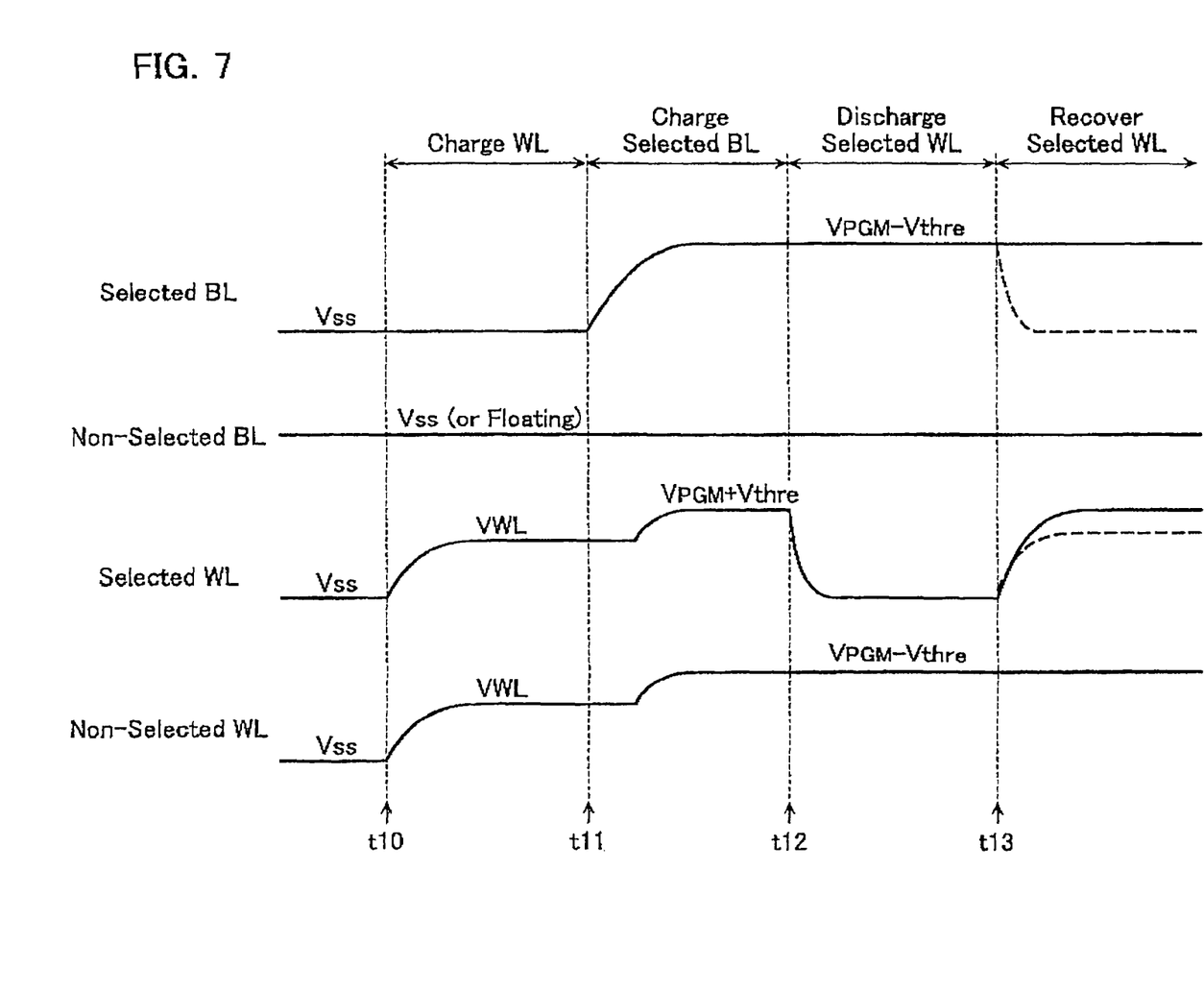
FIG. 7 is a diagram illustrating an operational waveform in writing for the memory cell array configuration of FIG. 6.

Referring now to FIG. 7, the description is made to a write operation in the case of the same memory cell array configuration as illustrated in FIG. 6. In FIG. 6, a corresponding rectifying element D is forward-biased when a positive bias is applied to a bit line BL, and the corresponding rectifying element D is reverse-biased when a positive bias is applied to a word line WL.

In this case, the roles of bit lines and word lines are contrary to the above-mentioned case. Firstly, all of the word lines are set to a voltage VWL (e.g., a power-supply voltage Vdd or otherwise) of not less than the rectifying-element threshold, which is not less than Vthre (at timing t10). Secondly, a write voltage VPGM (>VWL) is applied to the selected bit line (at timing t11). At this moment, the non-selected bit lines are retained at Vss or floating states.

Although currents begin to flow into the non-selected memory elements when the level of the selected bit line increases to be equal to or higher than VWL+Vthre, little voltage is applied to the memory element and the word lines rise to VPGM-Vthre. After the level of the selected bit line rises to VPGM, only the selected word line is discharged to Vss (at timing t12). As a result, a write voltage with VPGM-Vthre is applied only to the selected memory cell at intersection between the selected bit line and the selected word line. Upon completion of the write operation, the selected word line is returned to the VWL level.

The non-selected word lines are retained at VPGM-Vthre. Accordingly, write operations may be performed in sequence on each of the memory cells along the selected bit line, by selecting word lines corresponding to the cells to be written to and discharging them to Vss one after another.

In this case, provided that the write voltage VPGM is VPGM>Vdd, the bit line driver 14 requires a boost voltage of not less than Vdd. The row driver 11 does not require any extra boost circuit if VWL=Vdd.

A preferable scheme for controlling data write operations will now be described below, together with a specific configuration of the sense amplifier 14.

Figure 8:
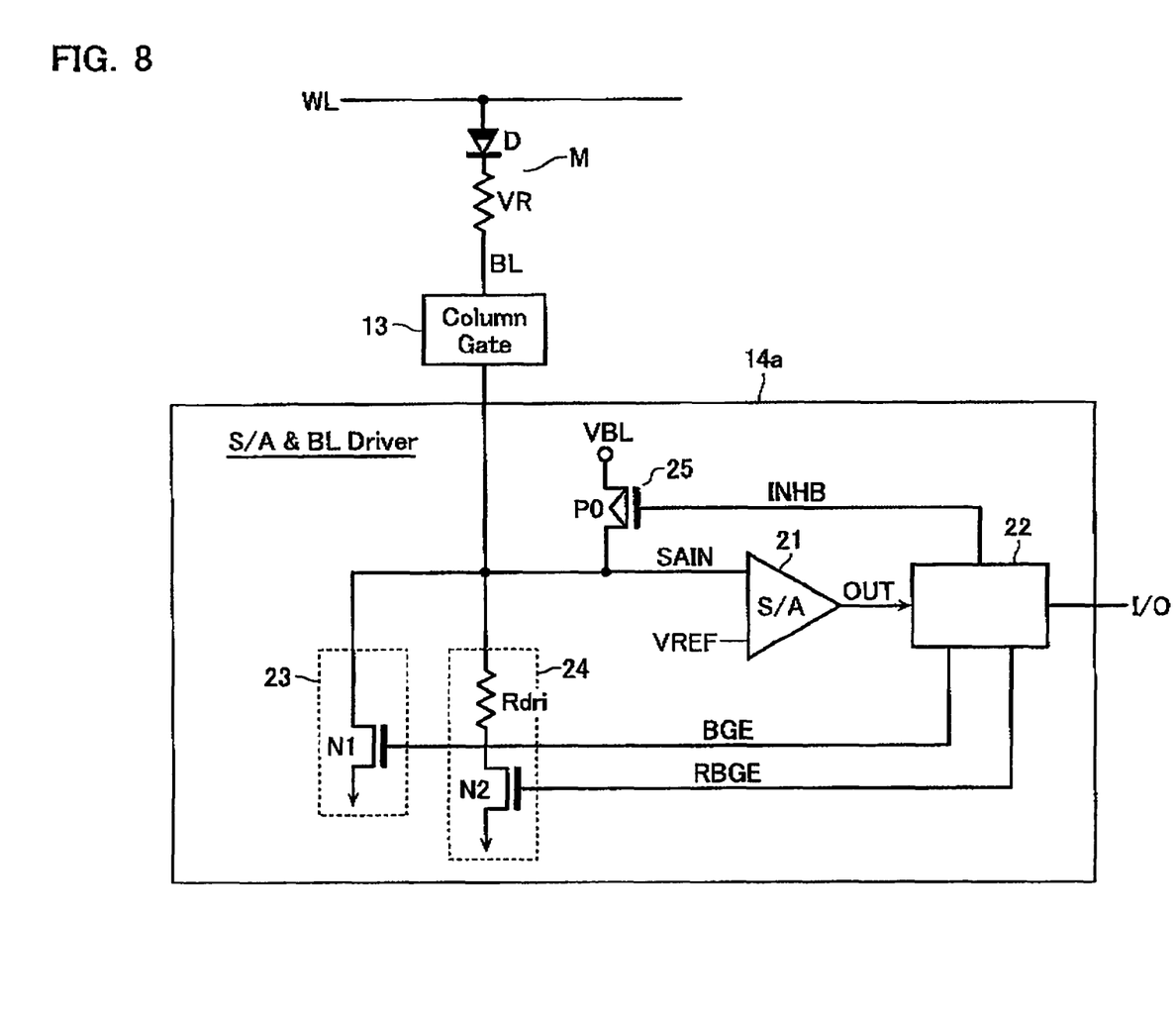
FIG. 8 is a diagram illustrating a configuration of a sense unit for the memory cell array of FIG. 1.

FIG. 8 illustrates a configuration of one sense unit 14a of the sense amplifier 14 for use in the case of the same memory cell array configuration as in FIG. 1. In this case, it is assumed that the sense unit 14a is configured to be switched to connect to a plurality of (e.g., eight) bit lines BL, e.g., via a column gate 13. A sense node SAIN, which is connected to a bit line of the sense unit 14a, is one input node of a differential sense amplifier 21. A reference voltage VREF is applied to the other input node of the differential sense amplifier 21.

The sense node SAIN is provided with a first current path 23 that connects it via an NMOS transistor N1 to a ground terminal Vss, and a second current path 24 that connects it via the resistor Rdri and the NMOS transistor N2 to the ground terminal Vss. The NMOS transistor N1 and the NMOS transistor N2 are controlled by a data processing circuit 22 in such a way that the NMOS transistor N1 is turned on in write "0", while the NMOS transistor N2 is turned on in write "1" (i.e., erase operation) and read operations.

The sense node SAIN is also provided with a PMOS transistor P0 for charging corresponding memory cells to VBL (Vdd or otherwise) when write operations to the corresponding memory cells are to be prohibited. That is, the PMOS transistor P0 configures a write-inhibit circuit 25.

Figure 9:
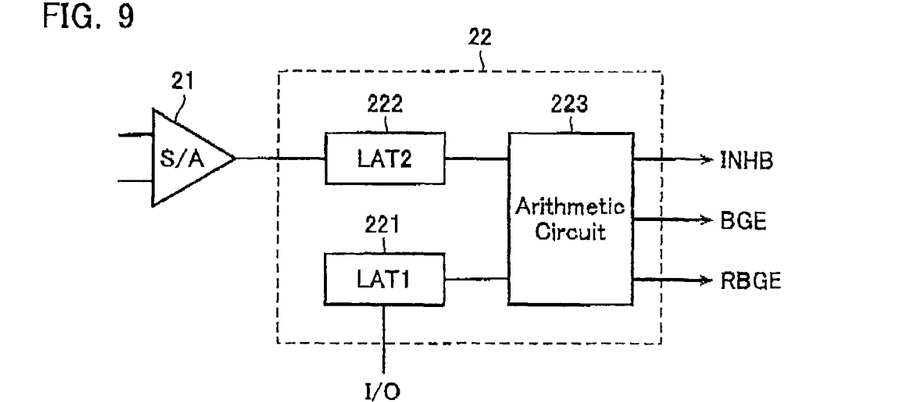
FIG. 9 is a diagram illustrating a configuration of a data processing circuit in the sense unit.

As illustrated in FIG. 9, the data processing circuit 22 has a data latch 221 for retaining write data provided from the outside, a data latch 222 for retaining read data from a cell array, and an arithmetic circuit 223 for generating bit-line voltage control signals, based on data of these data latches 221 and 222 depending on memory cells.

The sense unit 14a of FIG. 8 may be configured by only Vdd-type transistors, without any extra high-breakdown voltage transistor, since it has the same cell array configuration as in FIG. 1, where a corresponding rectifying element D is reverse-biased when a bit line BL is positively biased.

In this case, it is assumed that each memory cell is configured in such a way that write and erase modes may be controlled only by voltage values in a comparable pulse time. The selected memory cell is first read before writing to determine its data state.

As described above, a high-resistance state corresponds to data "0" and a low-resistance state corresponds to data "1", hereinafter, write "0" and write "1" may be merely referred to as "write" and "erase", respectively.

If data input from the outside is equal to that of the current memory cell, then any additional write or erase is not required. Thus, the selected memory cell is first read to check data in the memory cell. In reading data, a reading voltage is applied to the selected word line, the selected bit line is sensed while turning on the second current path 24, and a difference in the cell currents is detected at the differential sense amplifier 21. After the data is read, all bit lines BL are set to Vdd (or VREF).

Thereafter, the data input from the outside is compared with the read data. If they are identical, then no write is performed to the memory cell. Thus, a write-inhibit control signal becomes INHB="L", and a write control signal BGE and an erase control signal RBGE become BGE=RBGE="L". As a result, the write-inhibit circuit 25, i.e., the PMOS transistor P0 is switched on, the NMOS transistors N1 and N2 are switched off, and those bit lines BL connected to the sense node SAIN are retained at Vdd or VREF.

If the read data has a value different from that of the data input from the outside, then write or erase is performed. When write is performed, the data processing circuit 22 sets INHB=BGE="H" and RGBE="L". That is, the PMOS transistor P0 is switched off and the NMOS transistor N1 is switched on. As a result, the bit line of a memory cell to be written to is connected through the first current path 23 to the ground, without passing through a resistor, and VPGM-Vthre is applied to that memory cell.

On the other hand, when erase is performed, the data processing circuit 22 sets INHB=RBGE="H" and BGE="L". As a result, since the bit lines corresponding to a cell to be erased are connected through the second current path 24 via the resistor Rdri to the ground, a voltage of (VPGM−Vthre)× Rcell/(Rcell+Rdri) is applied to the memory cell, wherein Rcell is the cell resistance.

In erasing, although the amount of cell currents increases due to a transition of a variable resistive element in a corresponding memory cell from a high-resistance state to a low-resistance state, this embodiment may mitigate an increase in currents due to a change in resistance value of the element, by inserting each resistor Rdri into each bit line in erasing.

In addition, there is provided a higher level of the sense node SAIN through a transition of the variable resistive element from a high-resistance state to a low-resistance state in erasing. The sense amplifier 21 detects the transition of level to output INHB=RBGE="L" when a predetermined low-resistance state is obtained. As a result, the NMOS transistor N2 is switched off and the erase operation is terminated, which may prevent any current from flowing through after the resistance value is changed.

The above-mentioned example represents a case where write and erase may be performed with a comparable voltage VPGM. In this case, the write and erase may be performed at the same time into a plurality of memory cells connected to a plurality of sense units. However, if the write voltage is greatly different from the erase voltage, or if a significant difference exists in the required pulse width, it is necessary to perform write and erase at a different timing. Even then, the same applies for this example as those in the above-mentioned case: the selected bit line is directly connected to Vss in writing, and the selected bit line is connected via a resistor to Vss in erasing.

In order to perform write and erase on a plurality of cells on one word line at a different timing, a write voltage VPGM is first applied to the selected word line and only the bit line corresponding to a memory cell to be written is discharged. Upon completion of the write, the bit line is returned to VBL, an erase voltage VERA is set for the selected word line, and only the bit line corresponding to a memory cell to be erased is discharged. This enables write and erase to be performed on a group of memory cells along the one word line.

When a data write operation is performed on all of the memory cells connected to the selected word line, write operations may be performed continuously on a cell to be written, after which erase operations may be performed continuously on a cell to be erased, whereas bit lines may be selected in the order that they are arranged and write and erase may be performed in an alternate manner.

Figure 10:
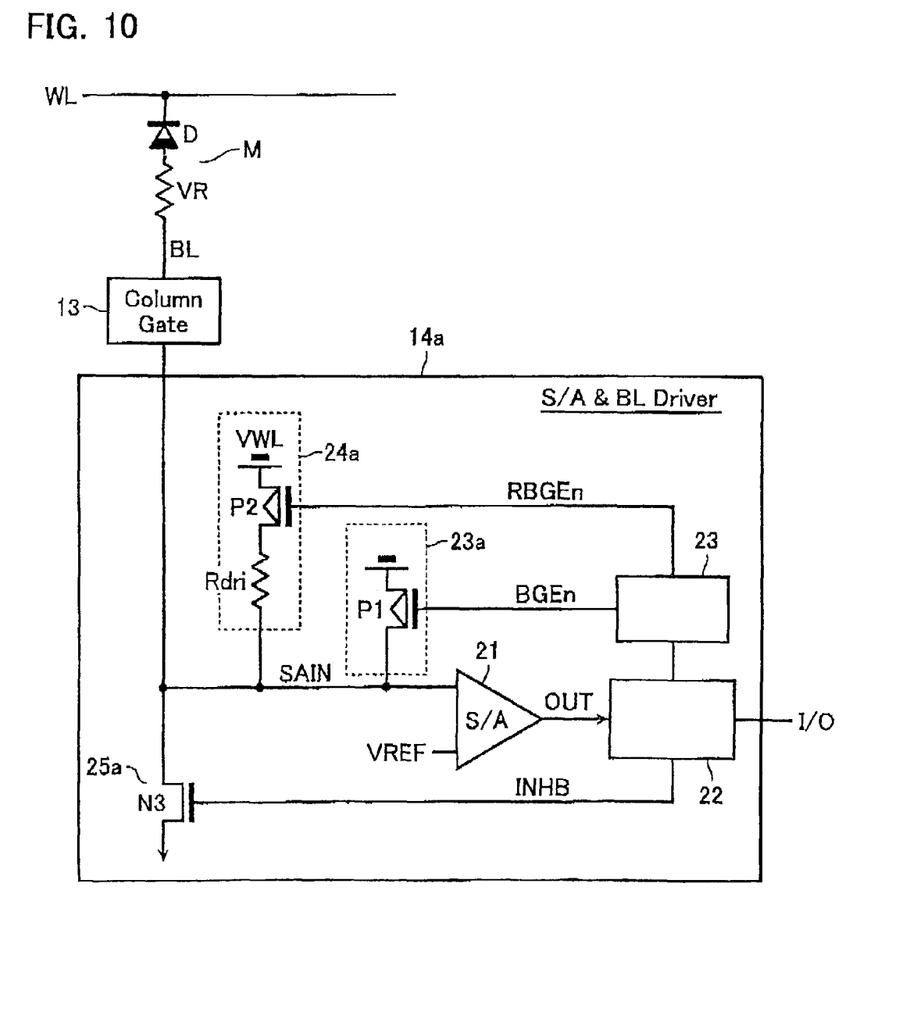
FIG. 10 is a diagram illustrating a configuration of a sense unit for the memory cell array of FIG. 6.

FIG. 10 illustrates a configuration of the sense unit 14a with the cell array configuration as illustrated in FIG. 6, where the bit lines are positively biased and the corresponding memory cells are forward-biased. The same applies for this example as those in the above-mentioned sense unit: the data processing circuit 22 outputs a write-inhibit control signal INHB, a write control signal BGEn, and an erase control signal RBGEn in response to the outputs from the sense amplifier 21. The meaning of the resistor Rdri is also the same as that for the sense unit.

A PMOS transistor P1 connected to the sense node SAIN is a first current path 23a for connecting a selected bit line directly to a VWL node in writing. A PMOS transistor P2 connected via the resistor Rdri to the sense node SAIN is a second current path 24a for connecting the selected bit line via the resistor Rdri to the VWL node in erasing. An NMOS transistor N3 for connecting a sense node directly to the ground configures a write-inhibit circuit 25a.

That is, when the NMOS transistor N3, which is driven by a write-inhibit control signal INHB, is switched on, the bit line is connected to the ground. The PMOS transistor P1, which is driven by a write control signal BGEn, connects the sense node SAIN directly to the VWL node in writing. On the other hand, the PMOS transistor P2, which is driven by an erase control signal RBGEn, connects the sense node SAIN via the resistor Rdri to the VWL node in erasing.

In this embodiment, such level shift is required between voltages of Vdd and VPGM/VERA since a write voltage VPGM and an erase voltage VERA are output from the bit line side. For this purpose, a level shift circuit 23 is provided.

Figure 11:
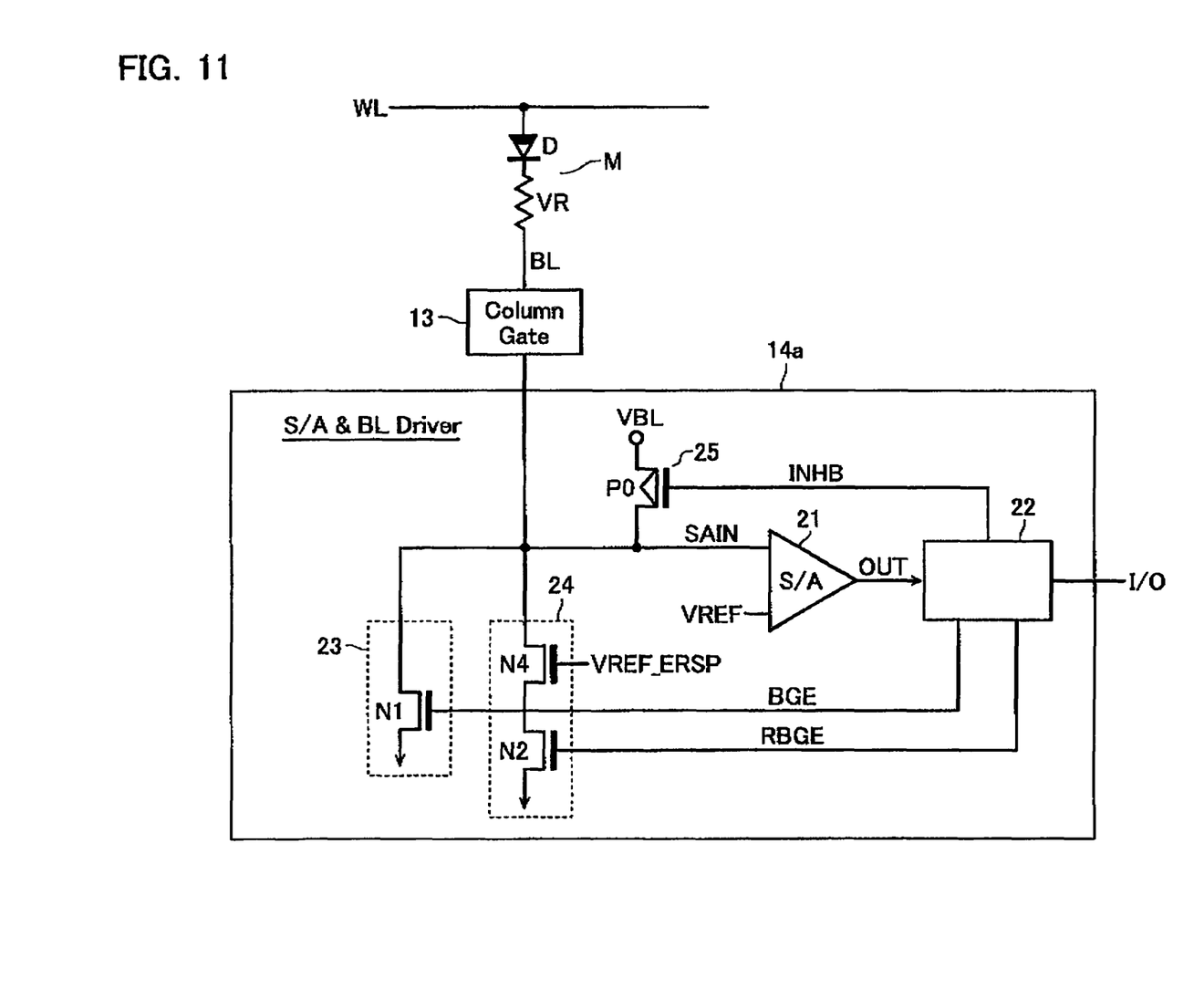
FIG. 11 is a diagram illustrating a variation of the sense unit of FIG. 8.
Figure 12:
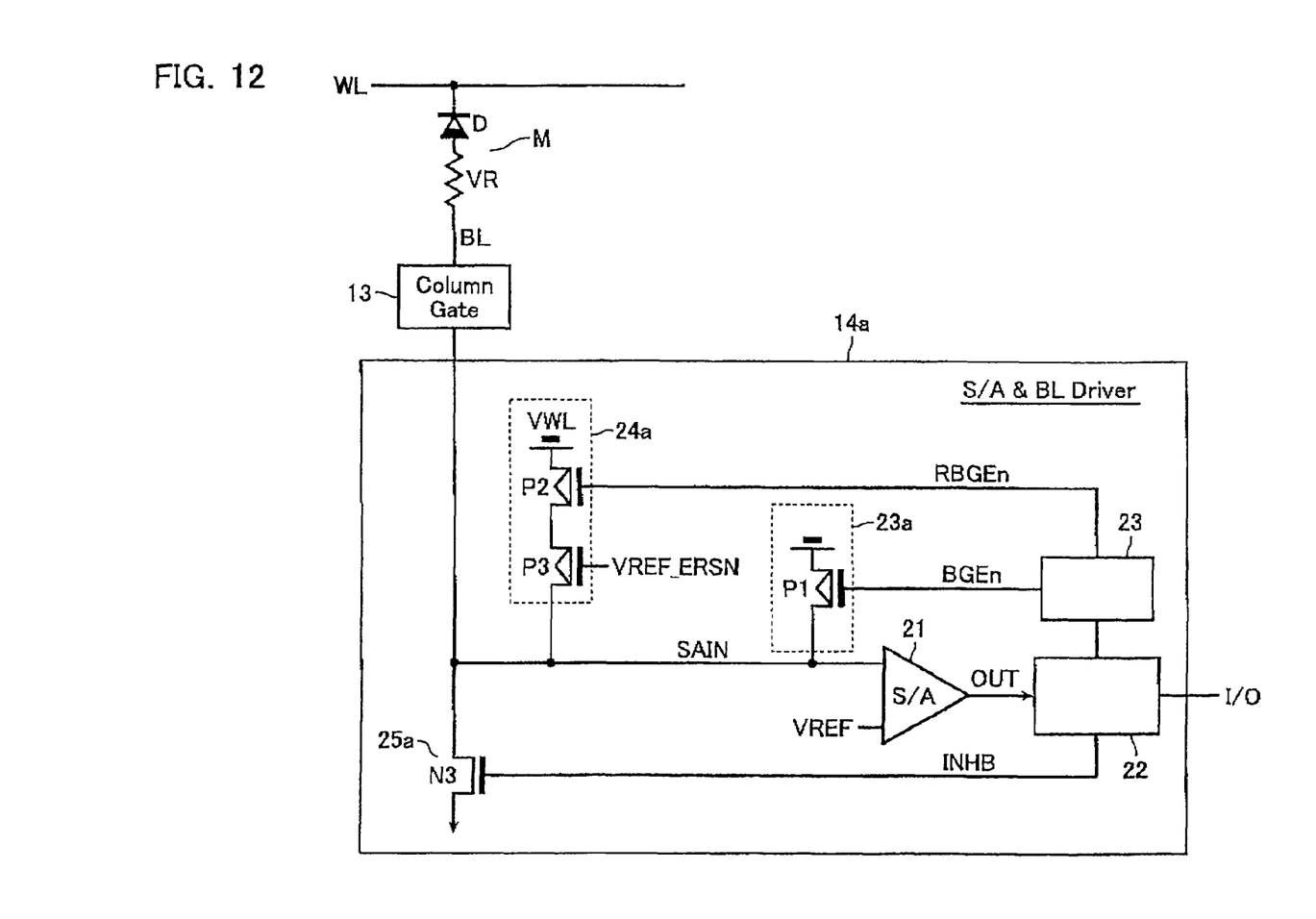
FIG. 12 is a diagram illustrating a variation of the sense unit of FIG. 10.

A MOS transistor may be used as the resistor Rdri of the sense unit in FIG. 8 or 10. FIG. 11 illustrates a case where the resistor Rdri of the sense unit 14a in FIG. 8 is replaced by an NMOS transistor N4. FIG. 12 illustrates a case where the resistor Rdri of the sense unit 14a in FIG. 10 is replaced by a PMOS transistor P3. By operating these MOS transistors as constant current sources through a predetermined gate bias, an alternative of the resistor element Rdri may be provided accordingly.

What is claimed is:

1. A method for writing data to a non-volatile memory device having first wirings and second wirings intersecting one another and memory cells arranged at each intersection therebetween, each of the memory cells having a variable resistive element and a rectifying element connected in series, the method comprising:
    charging the second wirings to a certain voltage not less than a rectifying-element threshold value, prior to a rise in a selected first wiring;
    charging the selected first wiring to a voltage required for writing or erasing; and
    discharging a selected second wiring,
    wherein after the selected second wiring is discharged, the selected second wiring is re-charged to the certain voltage, and
    wherein the time between discharging of the selected second wiring and re-charging of the selected second wiring to the certain voltage differs depending on data written in the selected memory cell.

2. The method for writing data to the non-volatile memory device according to claim 1, wherein
    the first wirings are word lines and the second wirings are bit lines, and each memory cell is connected to the word line and the bit line in such a way that the corresponding rectifying element is forward-biased when the word line is positively biased with respect to the bit line,
    in writing data, the bit lines are charged to a certain voltage not less than a rectifying-element threshold value, prior to a rise in a selected word line, and after the selected word line is charged to a voltage required for writing or erasing, a corresponding variable resistive element is shifted from a low-resistance state to a high-resistance state by connecting a selected bit line directly to the ground and discharging the selected bit line, whereas the corresponding variable resistive element is shifted from a high-resistance state to a low-resistance state by connecting the selected bit line via a resistor to the ground and discharging the selected bit line.

3. The method for writing data to the non-volatile memory device according to claim 2, wherein
    after the selected bit line is discharged, the selected bit line is re-charged to the certain voltage.

4. The method for writing data to the non-volatile memory device according to claim 3,
    wherein the time between discharging of the selected bit line and re-charging of the selected bit line to the certain voltage differs depending on data written in the selected memory cell.

5. The method for writing data to the non-volatile memory device according to claim 1, wherein
    first wirings are bit lines and second wirings are word lines, and each memory cell is connected to a word line and a bit line in such a way that a corresponding rectifying element is forward-biased when a bit line is positively biased with respect to a word line,
    in writing data, the word lines are charged to a certain voltage not less than a rectifying-element threshold value, prior to a rise in a selected bit line, and after the selected bit line is charged to a voltage required for writing or erasing, a corresponding variable resistive element is shifted from a low-resistance state to a high-resistance state by connecting a selected word line directly to the ground and discharging the selected word line, whereas the corresponding variable resistive element is shifted from a high-resistance state to a low-resistance state by connecting the selected word line via a resistor to the ground and discharging the selected word line.

6. The method for writing data to the non-volatile memory device according to claim 5, wherein
after the selected word line is discharged, the selected word line is re-charged to the certain voltage.

7. The method for writing data to the non-volatile memory device according to claim 6, wherein
the time between discharging of the selected word line and re-charging of the selected word line to the certain voltage differs depending on data written in the selected memory cell.

8. A method for writing data to a non-volatile memory device having first wirings and second wirings intersecting one another and memory cells arranged at each intersection therebetween, each of the memory cells having a variable resistive element and a rectifying element connected in series, the method comprising:
charging the second wirings to a certain voltage not less than a rectifying-element threshold value, prior to a rise in a selected first wiring;
charging the selected first wiring to a voltage required for writing or erasing; and
discharging a selected second wiring,
wherein:
all of the second wirings are charged, via the selected first wiring, to a voltage smaller than the voltage required for writing or erasing by a threshold voltage of the rectifying element, and
wherein after the selected second wiring is discharged, the selected second wiring is re-charged to the certain voltage.

9. The method for writing data to the non-volatile memory device according to claim 8, wherein the time between discharging of the selected second wiring and re-charging of the selected second wiring to the certain voltage differs depending on data written in the selected memory cell.

10. The method for writing data to the non-volatile memory device according to claim 8, wherein
the first wirings are word lines and the second wirings are bit lines, and each memory cell is connected to the word line and the bit line in such a way that the corresponding rectifying element is forward-biased when the word line is positively biased with respect to the bit line,
in writing data, the bit lines are charged to a certain voltage not less than a rectifying-element threshold value, prior to a rise in a selected word line, and after the selected word line is charged to a voltage required for writing or erasing, a corresponding variable resistive element is shifted from a low-resistance state to a high-resistance state by connecting a selected bit line directly to the ground and discharging the selected bit line, whereas the corresponding variable resistive element is shifted from a high-resistance state to a low-resistance state by connecting the selected bit line via a resistor to the ground and discharging the selected bit line.

11. The method for writing data to the non-volatile memory device according to claim 10, wherein
after the selected bit line is discharged, the selected bit line is re-charged to the certain voltage.

12. The method for writing data to the non-volatile memory device according to claim 11,
wherein the time between discharging of the selected bit line and re-charging of the selected bit line to the certain voltage differs depending on data written in the selected memory cell.

13. The method for writing data to the non-volatile memory device according to claim 8, wherein
first wirings are bit lines and second wirings are word lines, and each memory cell is connected to a word line and a bit line in such a way that a corresponding rectifying element is forward-biased when a bit line is positively biased with respect to a word line,
in writing data, the word lines are charged to a certain voltage not less than a rectifying-element threshold value, prior to a rise in a selected bit line, and after the selected bit line is charged to a voltage required for writing or erasing, a corresponding variable resistive element is shifted from a low-resistance state to a high-resistance state by connecting a selected word line directly to the ground and discharging the selected word line, whereas the corresponding variable resistive element is shifted from a high-resistance state to a low-resistance state by connecting the selected word line via a resistor to the ground and discharging the selected word line.

14. The method for writing data to the non-volatile memory device according to claim 13, wherein
after the selected word line is discharged, the selected word line is re-charged to the certain voltage.

15. The method for writing data to the non-volatile memory device according to claim 14, wherein
the time between discharging of the selected word line and re-charging of the selected word line to the certain voltage differs depending on data written in the selected memory cell.

* * * * *